(12) United States Patent
Futatsuyama et al.

(10) Patent No.: US 7,911,823 B2
(45) Date of Patent: Mar. 22, 2011

(54) METHOD OF PROGRAMMING A NON-VOLATILE MEMORY DEVICE

(75) Inventors: Takuya Futatsuyama, Yokohama (JP);
Koji Hosono, Fujisawa (JP); Toshiaki Edahiro, Yokohama (JP); Naoya Tokiwa, Fujisawa (JP); Kazushige Kanda, Kawasaki (JP); Shigeo Ohshima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 12/123,827

(22) Filed: May 20, 2008

(65) Prior Publication Data
US 2008/0291716 A1 Nov. 27, 2008

(30) Foreign Application Priority Data

May 21, 2007 (JP) .................................. 2007-133586

(51) Int. Cl.
*G11C 11/00* (2006.01)
*G11C 7/00* (2006.01)
*G11C 7/02* (2006.01)
*G11C 7/12* (2006.01)
*G11C 8/08* (2006.01)

(52) U.S. Cl. .................... 365/148; 365/189.16; 365/203; 365/206; 365/202

(58) Field of Classification Search .................. 365/148, 365/163, 189.16, 203, 206, 202
See application file for complete search history.

(56) References Cited

U.S. PATENT DOCUMENTS

| 6,831,854 | B2 | 12/2004 | Rinerson et al. |
| 6,992,920 | B2 | 1/2006 | Tamai et al. |
| 7,106,618 | B2 | 9/2006 | Morimoto |
| 7,283,387 | B2 | 10/2007 | Cho et al. |
| 7,307,268 | B2 | 12/2007 | Scheuerlein |
| 7,697,317 | B2 * | 4/2010 | Shimaoka et al. ............ 365/148 |
| 2006/0197115 | A1 * | 9/2006 | Toda ............................ 257/248 |
| 2006/0203541 | A1 | 9/2006 | Toda |
| 2007/0058425 | A1 * | 3/2007 | Cho et al. ...................... 365/163 |

FOREIGN PATENT DOCUMENTS

| JP | 2006-344349 | 12/2006 |
| JP | 2007-73176 | 3/2007 |

OTHER PUBLICATIONS

U.S. Appl. No. 12/266,884, filed Nov. 7, 2008, Tokiwa.
U.S. Appl. No. 12/752,646, filed Apr. 1, 2010, Kawaguchi.
Y. Hosoi, et al., High Speed Unipolar Switching Resistance RAM (RRAM) Technology, IEEE International Electroning Device Meeting, Technical Digest, 2006, 4 pages.

* cited by examiner

*Primary Examiner* — J. H. Hur
(74) *Attorney, Agent, or Firm* — Oblon, Spivak, McClelland, Maier & Neustadt, L.L.P.

(57) ABSTRACT

A method of programming a non-volatile memory device with memory cells formed of variable resistance elements and disposed between word lines and bit lines, includes: previously charging a selected word line and a selected bit line together with a non-selected word line and a non-selected bit line up to a certain voltage; and further charging the selected word line and the non-selected bit line up to a program voltage higher than the certain voltage and a program-block voltage, respectively, and simultaneously discharging the selected bit line.

13 Claims, 7 Drawing Sheets

WL/BL Voltage

WL/BL Voltage Difference

FIG. 6

WL/BL Voltage

Selected BL1    0V  Vdd almost 0V

Embodiment 1···Vpp
Embodiment 3···floating Vpp

Non-selected BL2    0V  Vdd 0V

Vpp

Selected WL1    0V  Vdd 0V

Non-selected WL2    0V  Vdd 0V 0V

WL/BL Voltage Difference almost Vpp

Selected ME-A (WL1-BL1)    0V  0V

Non-selected ME-B (WL2-BL1)    0V  almost 0V

Non-selected ME-C (WL1-BL2)    0V    almost 0V

Non-selected ME-D (WL2-BL2)    0V t0   t1    t2    t3

FIG. 10

METHOD OF PROGRAMMING A NON-VOLATILE MEMORY DEVICE

CROSS-REFERENCE TO RELATED APPLICATION

This application is based on and claims the benefit of priority from the prior Japanese Patent Application No. 2007-133586, filed on May 21, 2007, the entire contents of which are incorporated herein by reference.

BACKGROUND OF THE INVENTION

1. Field of the Invention

This invention relates to a memory device formed of electrically rewritable and non-volatile memory cells, and specifically relates to a method of programming a non-volatile memory device with variable resistance elements used as memory cells.

2. Description of the Related Art

Recently, there is noticed and researched a resistive RAM (ReRAM), as one of non-volatile memory devices, which has an electrically rewritable and variable resistance element for storing a resistance value as data.

A variable resistance element used as a memory cell in a ReRAM is constituted to have a stacked structure of electrode/metal oxide/electrode. It is known that there are two kinds of operation modes in the variable resistance elements as follows: in one mode, the polarity of applying voltage is exchanged, so that a high resistance state and a low resistance state are exchanged in a memory cell; and in the other mode, applying voltage value and applying time thereof are controlled without exchanging the applying voltage polarity, so that a high resistance state and a low resistance state are exchanged. These two modes are referred to as a bipolar type and a unipolar (or non-polar) type, respectively.

To achieve a highly integrated memory cell array, it is preferred to use the unipolar type because it is possible to constitute a memory cell array by stacking variable resistance elements and rectifying elements such as diodes at the respective cross points of word lines and bit lines without transistors.

In case a cross-point type of memory cell array is formed without rectifying elements, cross-talk noises cause program disturbances on non-selected cells. To reduce the influence of the cross-talk disturbance, it has been provided such a method as to apply a program-compensating voltage to the non-selected cells after applying a program voltage (refer to JP-A2006-344349).

On the other hand, to prevent the cross-talk of the cross-point type of cell array, it is useful that a rectifying element such as a diode is serially coupled to a variable resistance element (for example, refer to U.S. Pat. No. 6,831,854).

Further, in the cross-point type of cell array, both of data write and data erase may be performed with the same polarity voltage as each other, and a short pulse is used for data write while a long pulse is used for data erase. These are disclosed by Y. Hosoi et al, "High Speed Unipolar Switching Resistance RAM(RRAM) Technology" IEEE International Electron Device Meeting 2006, Technical Digest, p. 793-796.

SUMMARY OF THE INVENTION

According to an aspect of the present invention, there is provided a method of programming a non-volatile memory device with memory cells formed of variable resistance elements and disposed between word lines and bit lines, including:

previously charging a selected word line and a selected bit line together with a non-selected word line and a non-selected bit line up to a certain voltage; and further charging the selected word line and the non-selected bit line up to a program voltage higher than the certain voltage and a program-block voltage, respectively, and simultaneously discharging the selected bit line.

According to another aspect of the present invention, there is provided a method of programming a non-volatile memory device with memory cells formed of variable resistance elements and disposed between word lines and bit lines, including:

charging a selected word line and a selected bit line together with a non-selected word line and a non-selected bit line up to a program voltage; and discharging the selected bit line and the non-selected word line.

DETAILED DESCRIPTION OF THE EMBODIMENTS

Illustrative embodiments of this invention will be explained with reference to the accompanying drawings below.

Figure 1:
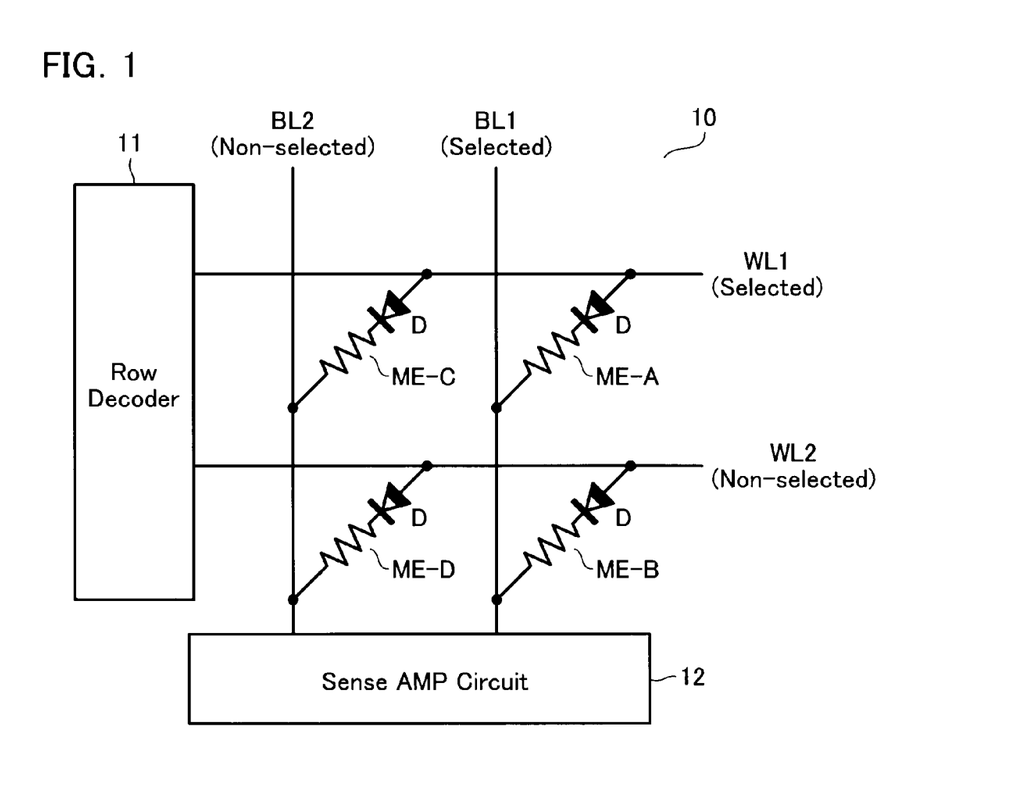
FIG. 1 shows a memory core configuration of an ReRAM in accordance with an embodiment of the present invention.

FIG. 1 shows a memory core of a non-volatile memory device in accordance with an embodiment. Memory cell array 10 is shown only for a range of 2×2 matrix. As shown in FIG. 1, row-direction (X-direction) wirings (refer to as word lines hereinafter) WL (WL1, WL2, . . . ) and column direction (Y-direction) wirings (refer to as bit lines hereinafter) BL (BL1, BL2, . . . ) are arranged, and non-volatile memory cells ME, each of which is formed of a variable resistance element, are disposed as the respective cross points.

In FIG. 1, as memory cells ME, four memory cells ME-A, ME-B, ME-C and ME-D are shown. Each memory cell is serially coupled to a rectifying device D. That is, one end of a memory cell ME is coupled to a bit line BL; and the other end to a word line WL via a rectifying device D. The rectifying device D is disposed in such a polarity that anode thereof is on the word line side.

Word lines WL are selectively driven by a row decoder 11 while bit lines BL are coupled to a sense amplifier circuit 12 for sensing data. The sense amplifier circuit 12 store program data and control bit line voltages in a data program mode.

Figure 2:
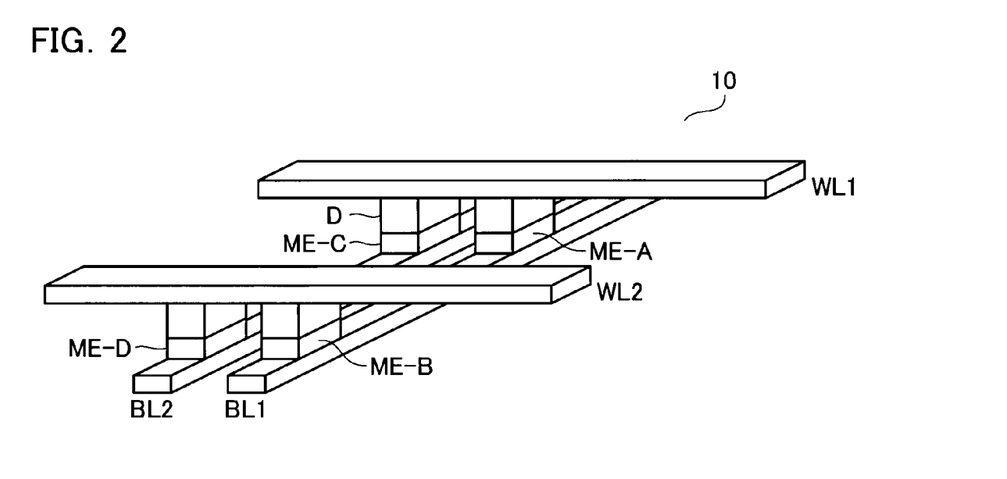
FIG. 2 shows a three-dimensional layout of the memory cell array.
Figure 3:
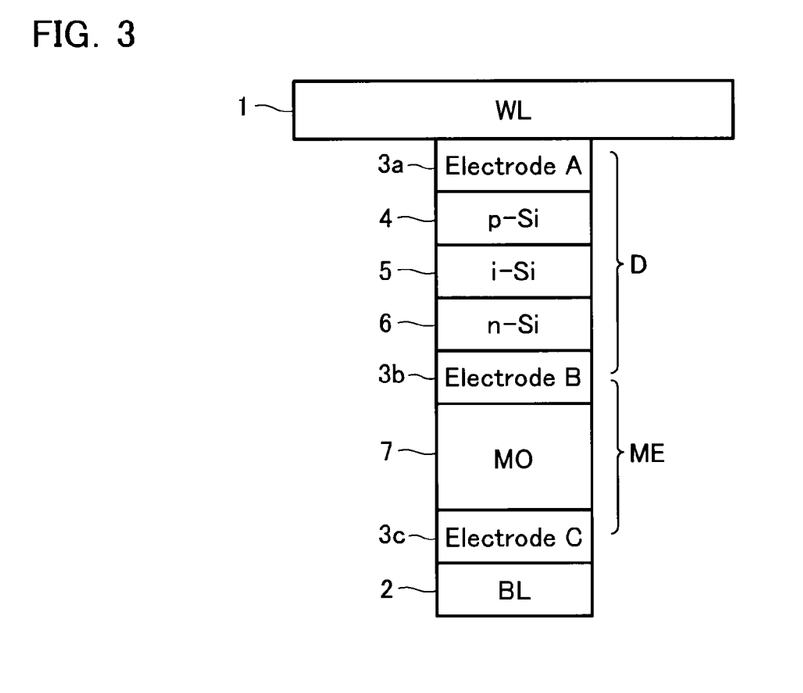
FIG. 3 shows a sectional structure of a memory cell in the memory core.
Figure 4:
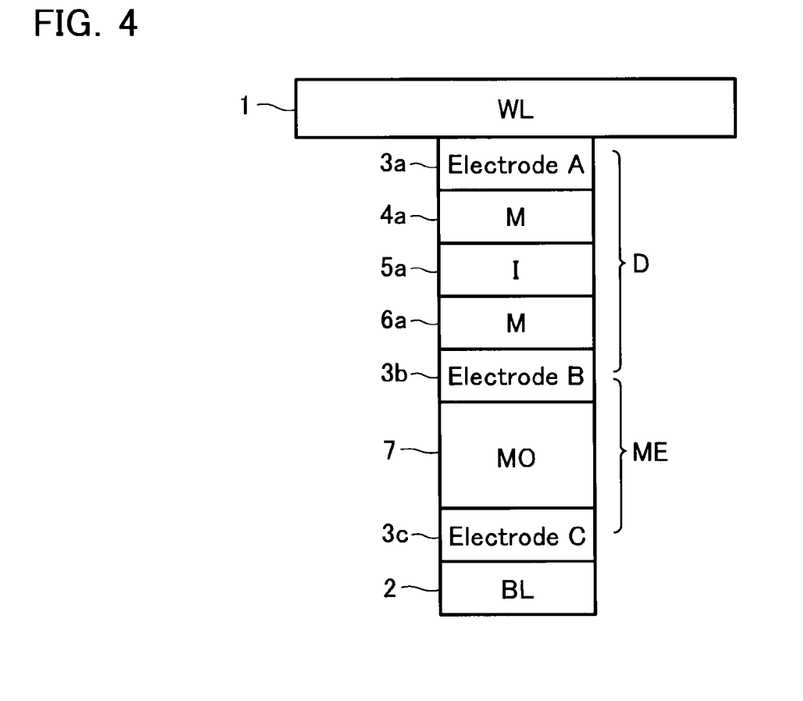
FIG. 4 shows another sectional structure of a memory cell in the memory core.

FIG. 2 shows a three-dimensional layout of the memory cell array 10, and FIGS. 3 and 4 show detailed examples of the stacked structures of memory cell ME and rectifying device D. Memory cell ME is formed of metal oxide (MO) film 7 sandwiched by electrodes 3b and 3c. In detail, used as the metal oxide is a transition metal oxide such as NiO and TiO. Alternatively, the metal oxide is doped with suitable impurities.

In case of FIG. 3, rectifying device D is a PIN-diode with p-type silicon layer 4/i-type silicon layer 5/n-type silicon layer 6 in FIG. 3, while in case of FIG. 4, it is an MIM diode with metal film 4a/insulating film 5a/metal film 6a.

Electrode 3 is formed of such a material film that is ohmic-contacted with word line (WL) 1 and rectifying device D. Electrode 3b is formed of such a material film that is ohmic-contacted with rectifying device D and memory cell ME. Electrode 3c is formed of such a material film that is ohmic-contacted with bit line (BL) 2 and memory cell ME.

In this embodiment, memory cell ME stores binary data in such a manner that a low resistance state (LRS) is defined as an erase state (for example, data "1") while a high resistance state (HRS) is defined as a write state (for example, data "0"). In this embodiment, data programming will be defined as follows: a "0" programming operation that brings a cell in a low resistance state LRS to be in a high resistance state HRS is defined as "program in the narrow sense" (or set) while a "1" programming operation that brings a cell in a high resistance state HRS to be in a low resistance state LRS is defined as "erase" (or reset).

FIG. 1 shows such a cell arrangement that when a word line WL is applied with a positive voltage, the corresponding rectifying device D is forward-biased. Note here that it is not limited to the above bias condition. It is effective with such an arrangement that when a bit line BL is applied with a positive voltage, the corresponding rectifying device D is forward-biased.

Next, it will be explained a problem to be solved in this invention with a detailed programming operation, and some embodiments for solving the problem.

As described above, in a unipolar-type ReRAM, data program (in a narrow sense) is performed with a pulse voltage application with a short pulse width (for example, 50 ns) while a data erase is performed with a pulse voltage application with a long pulse width (for example, 200 ns). Data read is performed in such a way as to apply a read voltage between a selected word line and a selected bit line for forward-biasing the diode and detect the cell current.

Figure 5:
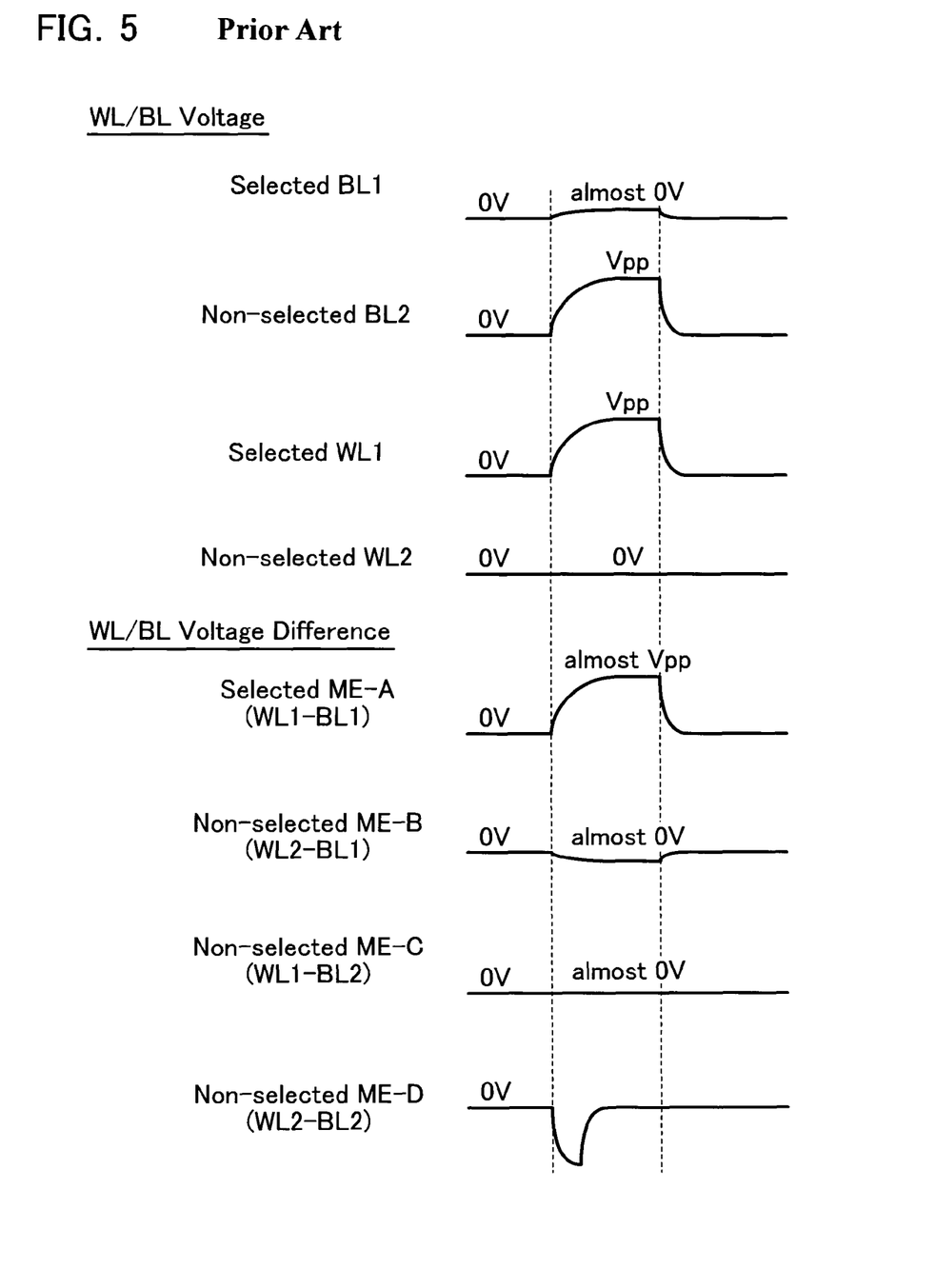
FIG. 5 shows voltage waveforms for explanation of the conventional data program operation.

FIG. 5 shows operation waveforms in a programming mode for programming memory cell ME-A disposed at the cross point of bit line BL1 and word line WL1 in the cell array shown in FIG. 1, i.e., voltage waveforms of word lines WL and bit lines BL, and those of four memory cells.

While the selected bit line BL1 is kept at about ground potential, Vss, the selected word line WL1 is applied with program voltage Vpp. At this time, non-selected word line WL2 is set at Vss while non-selected bit line BL2 is applied with Vpp as a program-block voltage.

With the above-described condition, only the selected memory cell ME-A is applied with about the program voltage Vpp. Explaining in detail, voltage applied to the selected memory cell ME-A is set to be lower than Vpp by the threshold voltage of the rectifying device.

In accordance with this basic program method, it takes a long time to charge the bit line and word line up to the highly boosted voltage Vpp or to discharge it, so that it takes a long time to control voltage applied to the memory cell. This becomes a large problem in accordance with the increase of capacitance and resistance of the bit line and word line together with that the memory is miniaturized and becomes to have a great capacity.

Specifically, it becomes difficult to apply a required program voltage to a selected memory cell in a short time in a program mode, in which it is required to apply a pulse voltage with a short pulse width.

Further, as shown in FIG. 5, when the selected memory cell is applied with the program voltage, the non-selected cell ME-D is temporarily applied with a reverse voltage in accordance with that the non-selected bit line is applied with program-block voltage. Although this reverse voltage is lost as a result of that the rectifying device D is charged up, it becomes a program disturbance for the non-selected memory cell.

In consideration of the above-described situation, it will be provided a program method, in which it is possible to charge-up a word line or a bit line to a high voltage at a high rate, whereby it become to be able to apply a voltage pulse to a selected memory cell in a short time. Detailed embodiments will be explained in comparison with the operation explained with reference to FIG. 5.

In the embodiments described below, data programming method will be explained in such a case as to bring or transform a memory cell to the high resistance state from the low resistance state, i.e., "program in the narrow sense". However, the same method may be adaptable to "erase" that brings a memory cell from a high resistance state to a low resistance state except that the voltage pulse width is different from that in the "program in the narrow sense". Further, it should be noted in this case that program voltages, e.g., Vpp1 and Vpp2, used in the "program in the narrow sense" mode and in the "erase" mode, respectively, may be set to be different from each other. In addition, it is desirable that the voltage pulse width used in the "erase" mode is set to be longer than that in the "program in the narrow sense".

Embodiment 1

Figure 6:
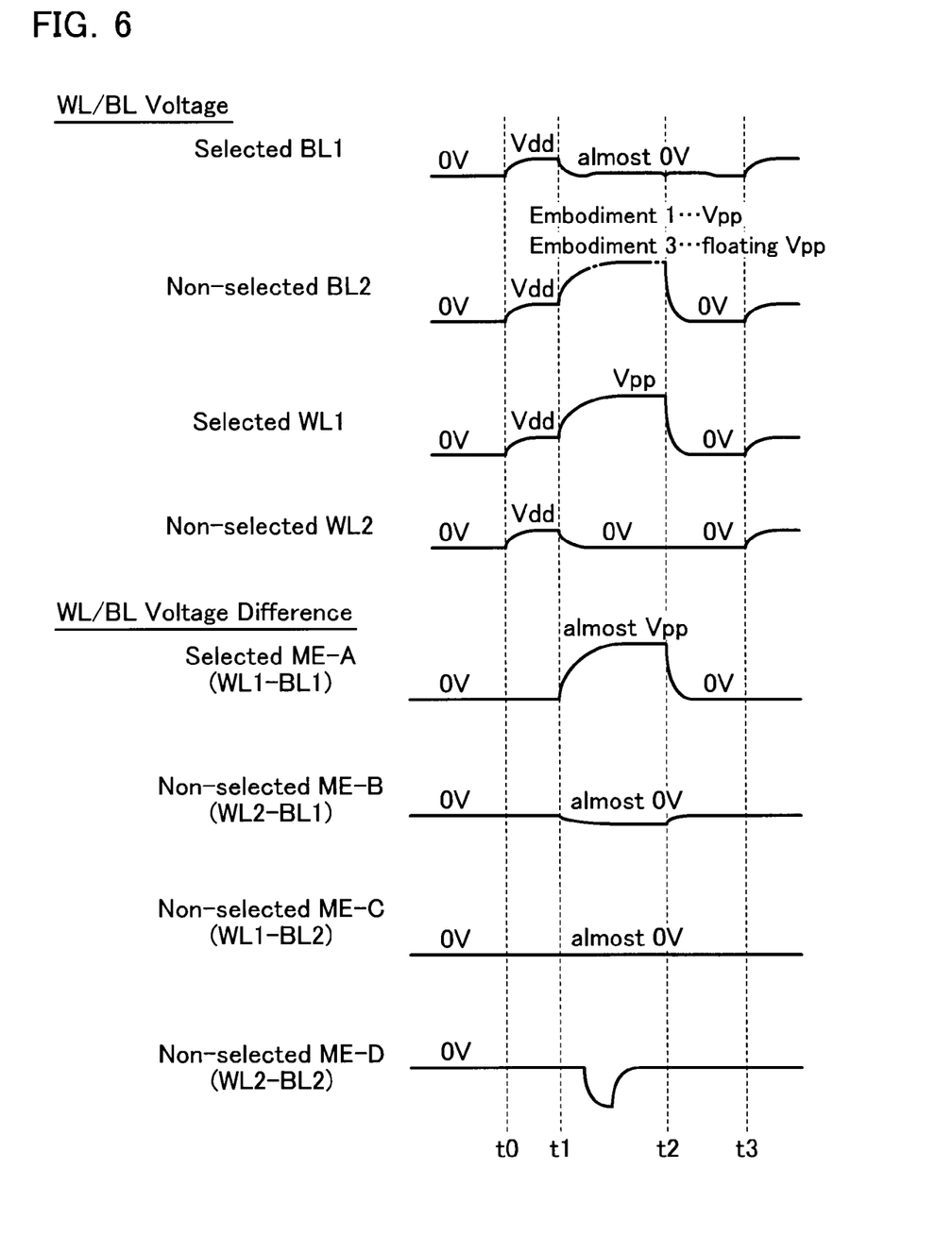
FIG. 6 shows voltage waveforms for explanation of program operations in accordance with Embodiments 1 and 3.

FIG. 6 shows program voltage waveforms in such a case that bit line BL1 and word line WL1 are selected like the case shown in FIG. 5. Prior to the application of the program voltage Vpp, charge all word lines and all bit lines up to the external power supply voltage Vdd or a suitable internal power supply voltage (timing t0). This operation may be performed simultaneously with the power-on operation of the memory chip.

Then, as similar to the example shown in FIG. 5, apply program voltage Vpp to the selected word line WL1, simultaneously apply program-block voltage Vpp to the non-selected bit line BL2, and simultaneously discharge the selected bit line to Vss (timing t1). Under this bias condition, only memory cell ME-A selected by the selected word line WL1 and the selected bit line BL1 is applied with the program voltage Vpp.

After the program voltage application during a predetermined time, a recovery operation is performed to discharge the word line and bit line applied with Vpp to Vss (timing t2). If previously charging all bit lines and word lines simultaneously with the power-on operation of the memory chip, or in case another selected cell is successively programmed, all bit lines and word lines are previously charged up to Vdd (timing t3).

According to this Embodiment 1, as a result of that the word lines and bit lines are pre-charged, the voltage swing of the selected word line and non-selected bit line to be boosted to the program voltage and program-block voltage, Vpp, respectively, is made less, so that the word line and bit line may be boosted at a high rate. Therefore, even if the parasitic resistance and capacitance of the word line and bit line are increased, it becomes possible to apply a program voltage with a short pulse width.

Further, as a result of the program voltage boosting with two steps, the reverse voltage applied to the non-selected memory cell ME-D will be reduced in amplitude in comparison with the example shown in FIG. 5, thereby resulting in that the program disturbance in the non-selected memory cell may be suppressed.

Note here that the program-block voltage to be applied to the non-selected bit line may be set to be slightly lower than the program voltage Vpp applied to the selected word line. Explaining in detail, the program-block voltage may be set at about Vpp-Vth or more (Vth: threshold voltage of the rectifying device D). Alternatively, an internal power supply voltage Vcc or the external power supply voltage Vdd may be also used. Specifically, in case the rectifying device D is coupled, as a result of that the program-block voltage is set at Vpp-Vth or more, it is able to suppress the wasteful current in a non-selected variable resistance element. This can be applied to embodiments explained below in the same way.

Embodiment 2

Figure 7:
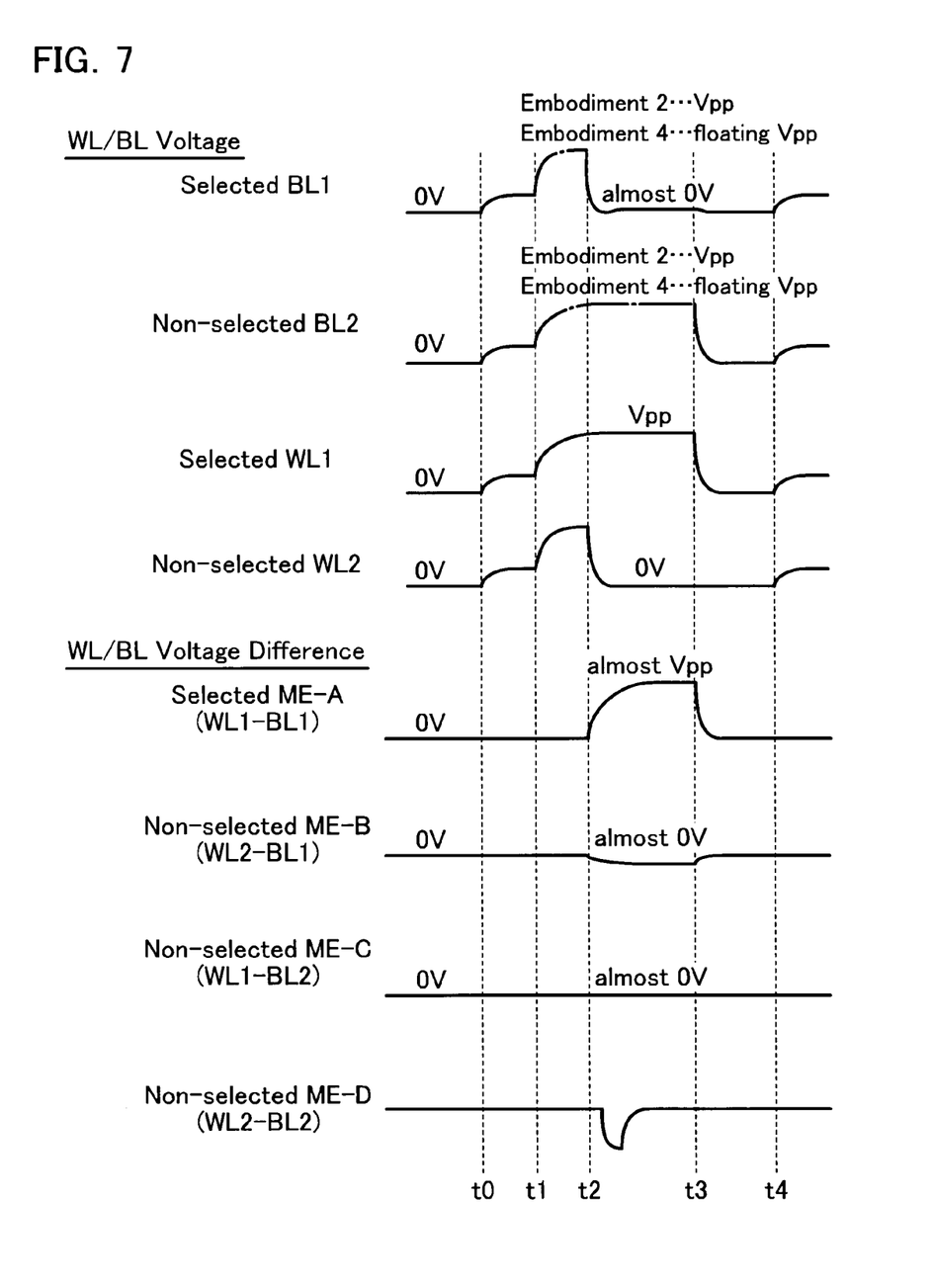
FIG. 7 shows voltage waveforms for explanation of program operations in accordance with Embodiments 2 and 4.

FIG. 7 shows program voltage waveforms in accordance with Embodiment 2 in such a case that bit line BL1 and word line WL1 are selected like the Embodiment 1. Prior to the program voltage Vpp application, charge all bit lines and all word lines up to the power supply voltage Vdd or another suitable internal power supply voltage (timing t0). So far, it is the same as Embodiment 1.

Successively charge up the all word lines and all bit lines to the program voltage Vpp (timing t1), and then discharge the non-selected word line WL2 and the selected bit line BL1 to the ground potential Vss (timing t2).

As a result, only the selected memory cell ME-A may be applied with about Vpp as similar to the Embodiment 1. After applying the program voltage, the selected word line and the non-selected bit line are discharged to Vss (timing t3). The time length t3-t2 is a program pulse width corresponding to the time length t2-t1 in the Embodiment 1 shown in FIG. 6. If previously charging all bit lines and word lines simultaneously with the power-on operation of the memory chip, or in case another selected cell is successively programmed, all bit lines and word lines are previously charged up to Vdd (timing t4).

In this Embodiment 2, the program voltage rising property of the selected cell is decided due to the discharge operation of the selected bit line BL1, and it will be made high-speed in comparison with the charging operation.

Note here in this Embodiment 2 that all word lines and all bit lines may be directly charged up to Vpp without the pre-charging operation to Vdd.

Embodiment 3

In the Embodiment 1, the non-selected bit line BL2 is charged up to Vpp. This is on the assumption that Vpp charging circuit is prepared in the sense amplifier circuit 12.

In consideration of this point, Embodiment 3 will be explained with reference to FIG. 6, which is a variation of the Embodiment 1. This Embodiment 3 is different from the Embodiment 1 as follows: non-selected bit line BL2 is charged up and set in a floating state of Vpp (Vpp-Vth in actual) via non-selected memory cell ME-C from the selected word line WL1 applied with the program voltage Vpp.

In this case, the non-selected bit line becomes a load coupled to the selected word line, so that it takes a long time to charge/discharge the selected word line WL1, and the non-selected cell may be disturbed due to wasteful current thereof. On the other hand, there is no need of preparing the Vpp charging circuit in the sense amplifier circuit 12. Therefore, the sense amplifier circuit area may be reduced, and the bit line pitch may also be reduced.

Embodiment 4

In the Embodiment 2, all bit lines are charged up to Vpp together with all word lines at timing t1. This is on the assumption that Vpp charging circuit is prepared in the sense amplifier circuit 12.

In consideration of this, Embodiment 4 will be explained with reference to FIG. 7, which is a variation of the Embodiment 2. This Embodiment 4 is different from the Embodiment 2 as follows: the bit lines are charged up and set in a floating state of Vpp (Vpp-Vth in actual) via memory cells from the selected word line WL1 applied with the program voltage Vpp.

In this case, the bit lines become a load of the row decoder for selecting a word line, so that it takes a long time to charge/discharge the selected word line WL1, and the non-selected cell may be disturbed due to wasteful current thereof. However, since the charging operation of all word line is used for charging all bit line, the increase of the row decoder's load is less in comparison with that in the Embodiment 3, in which non-selected bit lines are charged up by only the selected word line. In addition, since transitional cell current flows in all cells, the disturbance will be dispersed, and influence thereof will be made less.

On the other hand, there is no need of preparing the Vpp charging circuit in the sense amplifier circuit 12. Therefore, the sense amplifier circuit area may be reduced, and the bit line pitch may also be reduced similar to the Embodiment 3.

Next, the sense amplifier circuit 12 will be explained in detail below.

Figure 8:
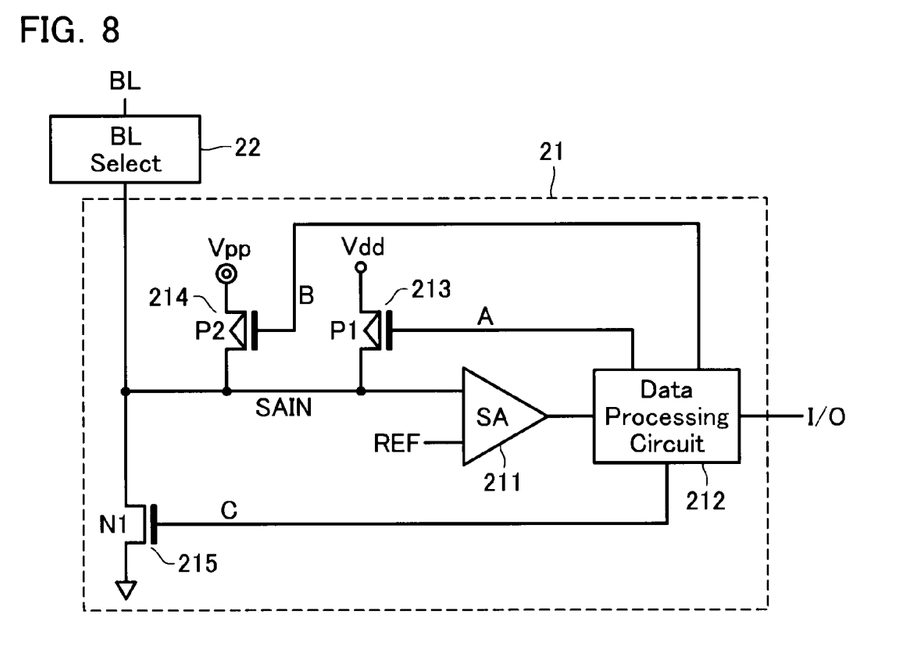
FIG. 8 shows a sense unit used in the Embodiments 1 and 2.

FIG. 8 shows a sense unit 21 in the sense amplifier circuit 12 used in the Embodiments 1 and 2. Sense node SAIN of the sense unit 21 is coupled to a bit line BL via bit line select circuit 22. Sense node SAIN is one input node of differential sense amplifier 211 while the other input node is applied with reference voltage REF.

Coupled to the sense node SAIN are NMOS transistor N1 for coupling it to the ground potential node Vss, PMOS transistor P1 for charging it up to the power supply voltage Vdd, and PMOS transistor P2 for charging it up to boosted program (or erase) voltage Vpp. NMOS transistor N1 constitutes a bit line discharging circuit 215 while PMOS transistors P1 and P2 constitute bit line charging circuits 213 and 214, respectively. PMOS transistor P1 is a high-breakdown voltage transistor.

Figure 10:
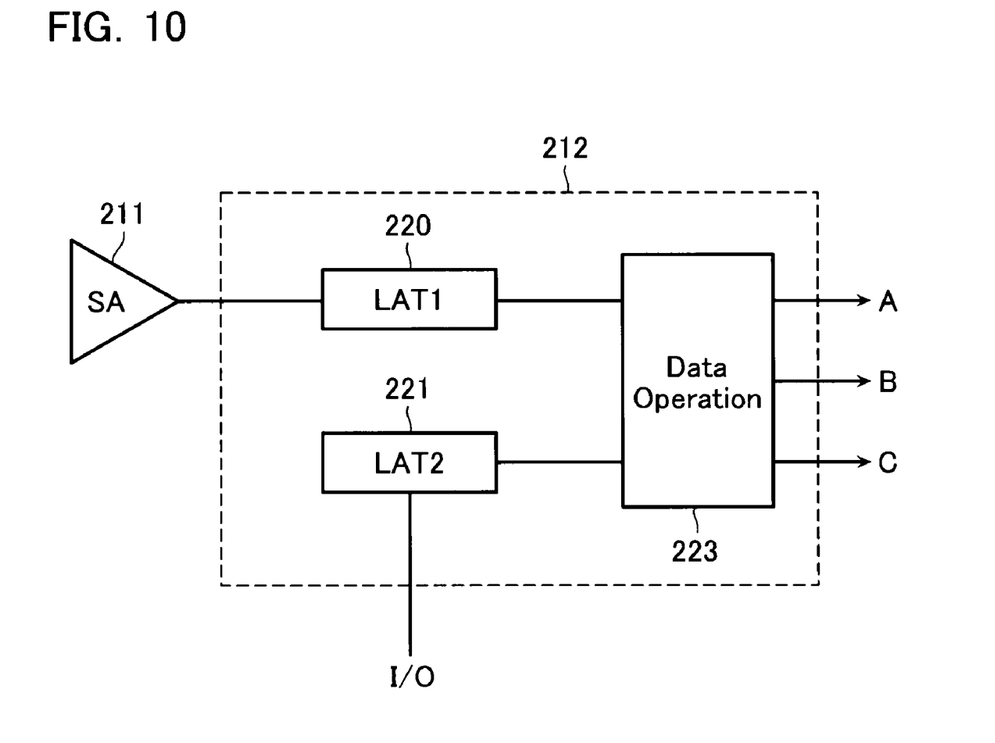
FIG. 10 shows the data processing circuit in the sense unit.

These NMOS transistor N1, PMOS transistors P1 and P2 are ON/OFF driven by data processing circuit 212 in accordance with operation modes. Data processing circuit 212 is, as shown in FIG. 10, formed of data latch 221 for storing externally loaded program data, data latch 220 for storing read data from the cell array, and data operation circuit 223 for generating bit line voltage control signals in accordance with data in data latches 220 and 221 and in accordance with memory cells.

The operation of the sense unit in the program mode will be explained briefly. In case of Embodiment 1, to charge all bit lines to Vdd, PMOS transistor P1 is on-driven at timing t0. At timing t1, PMOS transistor P1 is off, and NMOS transistor N1 becomes on in one sense unit corresponding to the selected bit line, thereby discharging the bit line while PMOS transistor P2 becomes on in another sense unit corresponding to the non-selected bit line, thereby charging it up to Vpp.

It is the same as in the Embodiment 2. That is, NMOS transistor N1 and PMOS transistors P1 and P2 are selectively on/off-driven in accordance with program data and timings.

Figure 9:
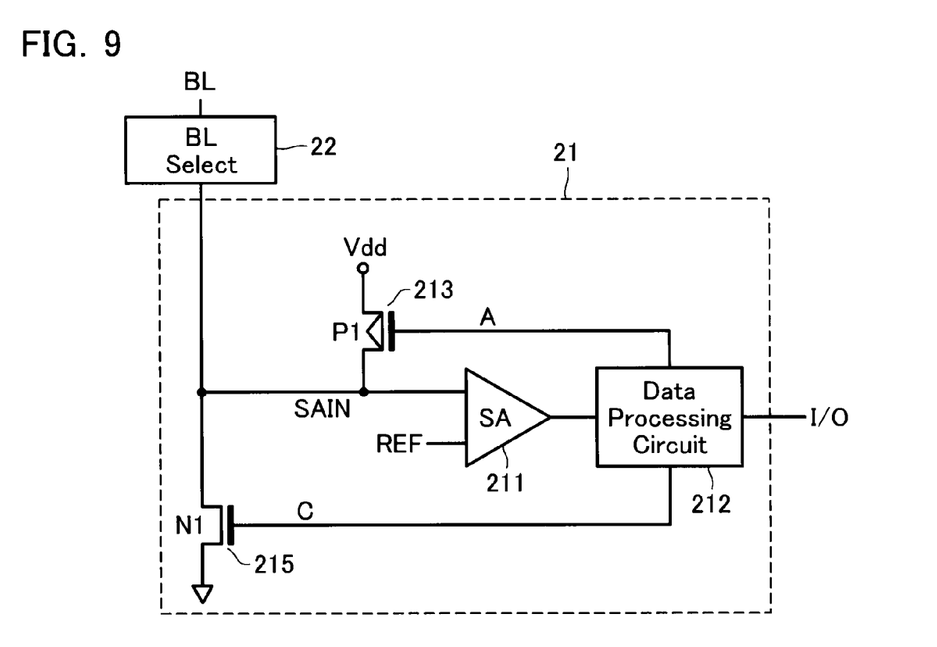
FIG. 9 shows a sense unit used in the Embodiments 3 and 4.

FIG. 9 shows another sense unit 21 used in the Embodiment 3 or 4. In the Embodiment 3 or 4, Vpp charging of a bit line is performed via a memory cell from a selected word line. Therefore, as different from that shown in FIG. 8, bit line Vpp charging circuit 214, i.e., PMOS transistor P2, will be omitted. The others are the same as that shown in FIG. 8.

Since high-breakdown voltage transistor P2 for transferring the high voltage Vpp is omitted, the sense unit area will be reduced in comparison with that shown in FIG. 8, and the bit line pitch will be also reduced.

This invention is not limited to the above-described Embodiments. Although, in the above-described Embodiments, rectifying devices are coupled to the variable resistance elements are coupled, it should be noted that this invention is adaptable to such a memory device that rectifying devices are not used in memory cells.

Further, it will be understood by those skilled in the art that various changes in form and detail may be made without departing from the spirit, scope, and teaching of the invention.

What is claimed is:

1. A method of programming a non-volatile memory device with memory cells formed of variable resistance elements and disposed between word lines and bit lines, comprising:
    previously charging a selected word line and a selected bit line together with a non-selected word line and a non-selected bit line up to a certain voltage; and
    further charging the selected word line and the non-selected bit line up to a program voltage higher than the certain voltage and a program-block voltage, respectively, and simultaneously discharging the selected bit line,
    wherein the non-selected bit line being charged up to the program-block voltage in a floating state via a non-selected memory cell from the selected word line applied with the program voltage.

2. The method according to claim 1, wherein
    each memory cell stores one of first and second data states, the first data state having a lower resistance than the second data state,
    a discharge operation of the selected bit line causes a selected memory cell disposed between the selected word line and the selected bit line to be applied with the program voltage and brought to the second data state from the first data state.

3. The method according to claim 1, wherein
    each memory cell stores one of first and second data states, the first data state having a lower resistance than the second data state,
    a discharge operation of the selected bit line causes a selected memory cell disposed between the selected word line and the selected bit line to be applied with the program voltage and brought to the first data state from the second data state.

4. The method according to claim 1, wherein
    each memory cell includes a rectifying device serially coupled to a variable resistance element.

5. The method according to claim 1, wherein
    the certain voltage is a power supply voltage, and
    the program voltage and the program-block voltage are boosted voltages substantially equal to each other.

6. A method of programming a non-volatile memory device with memory cells formed of variable resistance elements and disposed between word lines and bit lines, comprising:
    pre-charging a selected word line and a selected bit line together with a non-selected word line and a non-selected bit line up to a certain voltage lower than a program voltage;
    charging the selected word line and the selected bit line together with the non-selected word line and the non-selected bit line up to the program voltage; and
    discharging the selected bit line and the non-selected word line.

7. The method according to claim 6, wherein
    the selected bit line and the non-selected bit line are charged up to the program voltage in a floating state via memory cells from the selected word line applied with the program voltage.

8. The method according to claim 6, wherein
    each memory cell stores one of first and second data states, the first data state having a lower resistance than the second data state,
    the discharge operation of the selected bit line and the non-selected word line causes a selected memory cell disposed between the selected word line and the selected bit line to be applied with the program voltage and brought to the second data state from the first data state.

9. The method according to claim 6, wherein
    each memory cell stores one of first and second data states, the first data state having a lower resistance than the second data state,
    the discharge operation of the selected bit line and the non-selected word line causes a selected memory cell disposed between the selected word line and the selected bit line to be applied with the program voltage and brought to the first data state from the second data state.

10. The method according to claim 6, wherein
    each memory cell includes a rectifying device serially coupled to a variable resistance element.

11. The method according to claim 6, wherein
    the certain voltage is a power supply voltage, and
    the program voltage is a boosted voltage.

12. A method of programming a non-volatile memory device with memory cells formed of variable resistance elements and disposed between word lines and bit lines, comprising:
    charging a selected word line and a selected bit line together with a non-selected word line and a non-selected bit line up to a program voltage; and
    discharging the selected bit line and the non-selected word line,
    wherein the selected bit line and the non-selected bit line being charged up to the program voltage in a floating state via memory cells from the selected word line applied with the program voltage.

13. The method according to claim 12, wherein
    the program voltage is a boosted voltage.

* * * * *